US006218290B1

(12) United States Patent
Schonauer et al.

(10) Patent No.: US 6,218,290 B1
(45) Date of Patent: *Apr. 17, 2001

(54) COPPER DENDRITE PREVENTION BY CHEMICAL REMOVAL OF DIELECTRIC

(75) Inventors: Diana M. Schonauer, San Jose; Steven C. Avanzino, Cupertino; Kai Yang, Fremont, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/199,267

(22) Filed: Nov. 25, 1998

(51) Int. Cl.$^7$ ..................................................... H01L 21/00
(52) U.S. Cl. ........................... 438/633; 438/12; 438/626; 438/627; 438/906
(58) Field of Search .................................. 438/622, 626, 438/627, 633, 906, 12

(56) References Cited

U.S. PATENT DOCUMENTS 6,001,730 * 12/1999 Farkas et al. .......................... 438/627
6,074,949 *  6/2000 Schonauer et al. ................... 438/692

* cited by examiner

Primary Examiner—Chandra Chaudhari
Assistant Examiner—Lisa Kilday

(57) ABSTRACT

The formation and/or growth of dendrites emanating from Cu or Cu alloy lines into a bordering open dielectric field are prevented or substantially reduced by chemically removing a portion of the surface from the dielectric field and between the lines after CMP. Embodiments include removing up to 20 Å of silicon oxide by buffing with a solution containing ammonium fluoride, diammonium hydrogen citrate, triammonium citrate and dionized water.

18 Claims, 1 Drawing Sheet

COPPER DENDRITE PREVENTION BY CHEMICAL REMOVAL OF DIELECTRIC

TECHNICAL FIELD

The present invention relates semiconductor devices comprising copper (Cu) or Cu alloy interconnection patterns. The present invention is applicable to manufacturing high speed integrated circuits having submicron design features and reliable high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped monocrystalline silicon, and a plurality of sequentially formed inter-layer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing an inter-layer dielectric on a conductive layer comprising at least one conductive pattern, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more, as in submicron technologies, the interconnection capacitance limits the circuit node capacitance loading and, hence, the circuit speed. As the length of metal interconnects increases and cross-sectional areas and distances between interconnects decrease, the RC delay caused by the interconnect wiring increases. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for Al in VLSI interconnection metalizations. Cu is relatively inexpensive, has a lower resistivity than Al, and has improved electrical properties vis-a-vis W. Accordingly, Cu a desirable metal for use as a conductive plug as well as metal wiring.

An approach to forming Cu plugs and wiring comprises the use of damascene structures employing CMP, as in Teong, U.S. Pat. No. 5,693,563. However, due to Cu diffusion through the dielectric interlayer, Cu interconnect structures must be encapsulated by a diffusion barrier layer. Typical diffusion barrier materials include tantalum (Ta), tantalum nitride (TaN), titanium (Ti), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology. For example, conventional practices comprise forming damascene openings in an inter-layer dielectric, depositing a barrier layer, such as TaN, lining the opening and on the surface of the interdielectric layer, and depositing Cu or a Cu alloy layer. CMP is then performed with a slurry, typically an aqueous suspension containing a particulate abrasive, such as alumina, an organic dispersant and an oxidizing agent. CMP is then conducted stopping substantially on the underlying TaN barrier layer. Buffing, employing de-ionized water, is then conducted on a buff pad to remove remaining or residual slurry particles. CMP is then performed employing a more aggressive slurry to remove the underlying TaN barrier layer followed by water buffing on a buff pad to remove residual slurry particles. Subsequent to such CMP procedures, double sided brush scrubbing is typically conducted using water to remove particulate material from the surfaces of the wafer. It was found, however, that such conventional practices left a high level of copper contamination on the surface of the dielectric field adjacent to the Cu or Cu alloy lines, e.g. about 1 to about 2 $E^{15}$ atoms/$cm^2$ of Cu, as detected by TOF (time of flight) SIMS (secondary ion mass spectrometry). This level of Cu contamination in an open field resulted in the growth of dendrites emanating from the edges of Cu or Cu alloy lines into the open dielectric field. Such Cu or Cu compound dendrites typically extend up to about 1 micron and are about 150 Å to about 250 Å thick. Such Cu and Cu compound dendrites reduce the insulating properties of the open dielectric field and can cause shorting by bridging with other Cu or Cu alloy lines.

There exist a need for methodology enabling the formation of reliable Cu and Cu alloy interconnection patterns without the formation of dendrites emanating from Cu or Cu alloy lines.

DISCLOSURE OF THE INVENTION

An advantage of the present invention is a method of manufacturing a semiconductor device comprising highly reliable Cu or Cu alloy interconnects, without dendrites emanating from Cu or Cu alloy lines.

Another advantage of the present invention is a method of preventing dendritic growth from Cu or Cu alloy lines into a bordering open dielectric field.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device on a wafer, the method comprising: forming a copper (Cu) or Cu alloy interconnection pattern comprising a dense array of spaced apart Cu or Cu alloy lines bordering an open dielectric field on a surface of the wafer; and chemically treating the wafer surface to remove a sufficient amount of dielectric material from the open dielectric field to prevent or substantially reduce subsequent formation and/or growth of Cu or Cu compound dendrites from the lines into the open dielectric field.

Another aspect of the present invention is a method of preventing the growth of dendrites emanating from Cu or Cu alloy lines into a bordering open dielectric field on a wafer, the method comprising chemically treating the wafer surface to remove a portion of dielectric material from the surface of the open dielectric field and between the lines.

Embodiments include forming damascene openings in a silicon oxide layer, depositing a barrier layer, such as TaN, lining the openings and on the silicon oxide layer, filling the openings with Cu or a Cu alloy, CMP stopping substantially on the barrier layer, CMP to remove the barrier layer stopping on the surface of the silicon oxide, and buffing the wafer surface with a buff pad containing a chemical agent to remove up to about 20 Å of silicon oxide. Embodiments further include employing a chemical agent containing ammonium fluoride, diammonium hydrogen citrate, triammonium citrate, an inhibitor and de-ionized water.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
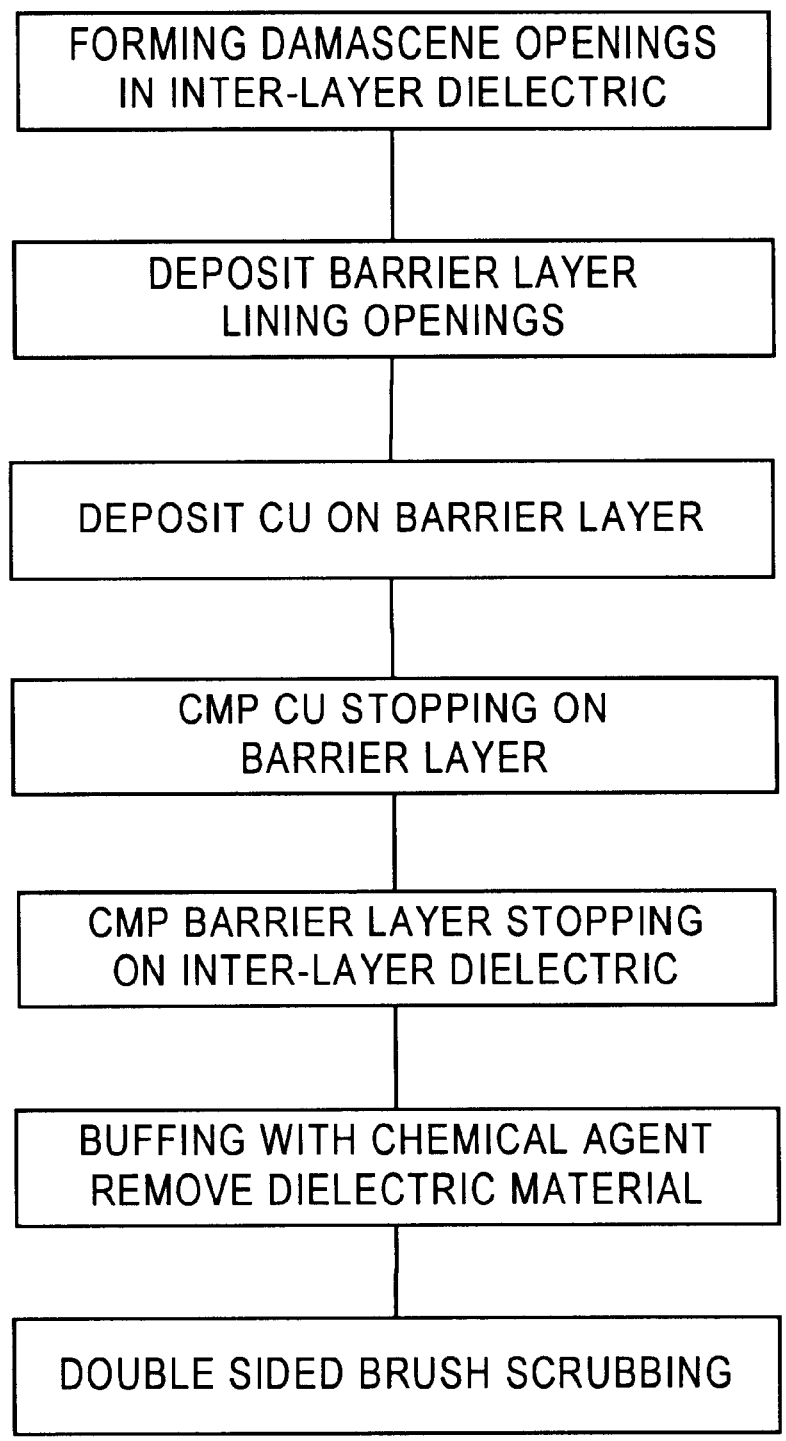
FIG. 1 is a flow diagram illustrating sequential phases of a method in accordance with an embodiment of the present invention.

The present invention addresses and solves problems attendant upon conventional CMP methodology in planarizing a Cu or Cu alloy interconnection pattern comprising a dense array of Cu or Cu alloy lines bordering an open dielectric field by eliminating or substantially reducing the formation and/or growth of dendrites emanating from the Cu or Cu alloy lines into the bordering open dielectric field. Accordingly, the present invention enables effective and efficient use of Cu or Cu alloy metalization for interconnection patterns employing damascene technology in manufacturing submicron semiconductor devices, e.g., semiconductor devices having a design rule of about 0.18 micron and under. As employed throughout this application, the symbol Cu is intended to encompass high purity elemental copper as well as Cu-based alloys, such as Cu alloys containing minor amounts of tin, zinc, manganese, titanium and germanium. As also employed throughout this application, the expression "dense array" denotes Cu or Cu alloy lines spaced apart by a distance less than 2 microns, e.g., less than one micron, while the expression "open field", "open dielectric field" or "open silicon oxide field" denotes a distance greater than about 2 microns between conductive lines, e.g., greater than about 10 microns. It should be recognized that an open field can extend further, e.g., up to 100 microns.

It was found that upon conducting conventional CMP planarization techniques after filling damascene openings to form a dense array of Cu or Cu alloy lines bordering an open field, e.g. open silicon oxide field, dendrites formed emanating from the Cu or Cu alloy lines growing into the bordering open silicon oxide field, thereby reducing the insulation capability of the silicon oxide field and generating shorts by bridging between Cu or Cu alloy lines. After extensive experimentation and investigation, it was found that the formation and growth of such dendrites are attributed to the double sided brush scrubbing technique conventionally conducted subsequent to CMP. Such double sided brush scrubbing is conventionally conducted to remove particulate contaminates adhering to and/or embedded in the surfaces of the wafer. Embodiments of the present invention comprise preventing or substantially reducing the formation and/or growth of dendrites, as during conventional double sided brush scrubbing, by chemically treating the wafer surface, i.e., the open dielectric field and Cu lines, with a chemical agent to remove a portion of the surface of the dielectric material from the surface of the wafer after CMP, such as up to about 25 Å, e.g., about 5 Å to about 15 Å. This inventive technique reduces the level of copper contamination in the open field, thereby preventing or substantially reducing the formation and/or growth of dendrites emanating from the Cu or Cu alloy lines. The chemical agent is selected based upon its ability to remove the dielectric material from the open field and between the lines of the dense array, e.g. silicon oxide, without attacking the narrow Cu or Cu alloy lines and without resulting in replating Cu or the Cu alloy on the open silicon oxide field.

In an embodiment of the present invention, the chemical agent is applied to a secondary platen buff pad, such as that conventionally employed subsequent to CMP to remove residual slurry from the wafer surface. Advantageously, by applying the chemical agent to the buff pad, less of the chemical agent is required and the procedure can be implemented quite rapidly, efficiently and in a cost effective manner.

In an embodiment of the present invention, a diluted solution of the solution for removing metal contaminants disclosed in U.S. Pat. No. 5,662,769 is employed as the cleaning agent, e.g., the disclosed solution diluted with de-ionized water by a factor of about 4 to about 25, such as about 6 to about 10, e.g. about 7. The entire disclosure of U.S. Pat. No. 5,662,769 is incorporated by reference herein. A cleaning agent suitable for use in the present invention for application to a buff pad comprises de-ionized water, ammonium fluoride, diammonium hydrogen citrate, triammonium citrate and, optionally an inhibitor to prevent etching of the Cu or Cu alloy lines. As disclosed in U.S. Pat. No. 5,662,769, hydrofluoric acid is produced by hydrolysis of free fluoride ions in solution. An example of a cleaning agent suitable for use in the present invention is a solution comprising: less than about 10 wt. % diammonium hydrogen citrate, such as, about 8.5 to less than about 10 wt. %, e.g., about 9.1 wt. %; less than about 10 wt. % triammonium citrate, such as about 6.5 to less than about 10 wt, %, e.g., about 7.5 wt. %; less than about 14.5 wt. % ammonium fluoride ($NH_4F$), such as about 3.5 to less than about 14.5 wt. %, e.g. about 14.2 wt. %; and less than about 70 wt. % de-ionized water, such as about 64 to less than about 70 wt. %; e.g. about 69.2 wt. %. The solution can contain up to less than about 0.2 vol. % of an inhibitor, such as benzotriazole (BTA) or 1,2,4-triazole.

In carrying out embodiments of the present invention employing a buff platen and the chemical agent, the optimum wafer pressure, rotation speed and tine can be readily determined for a particular situation. For example, it was found suitable to apply a wafer pressure of about 1 psi to about 3 psi, e.g. about 2 psi, while rotating the buff platen at about 30 rpm to about 70 rpm, e.g. about 50 rpm, for about 30 seconds to about 240 seconds, e.g. about 30 seconds to about 60 seconds.

Subsequent to implementing the chemical treating technique of the present invention, processing is continued in a conventional manner, as by conducting double sided brush scrubbing using water. Alternatively, conventional double sided brush scrubbing using water can be conducted subsequent to implementing the chemical treating technique of the present invention. Thus, the present invention can be easily integrated into existing facilities without significant equipment modification or new equipment.

Cu and/or Cu alloy interconnect members formed in accordance with embodiments of the present invention can be, but are not limited to, interconnects formed by damascene technology. Thus, embodiments of the present invention include forming a silicon oxide inter-layer dielectric overlying a substrate, forming damascene openings in the inter-layer dielectric, depositing a diffusion barrier layer, such as Ta or TaN, lining the opening and on the inter-layer dielectric, and filling the opening with Cu or a Cu alloy layer, Advantageously, the opening in the dielectric inter-layer can be filled with Cu or a Cu alloy by physical vapor deposition (PVD), CVD, electroless plating or electroplating. A conventional seed layer can be deposited on the barrier layer when electroplating or electroless plating the Cu or Cu alloy layer. CMP is then performed such that the upper surface of the Cu or Cu alloy layer is substantially coplanar with the upper surface of the inter-layer dielectric. The resulting Cu or Cu alloy interconnection pattern comprises a dense array of Cu or Cu alloy lines bordering an open silicon oxide field. The wafer surface is then chemically treated, as with the solution disclosed in U.S. Pat. No. 5,662,769 diluted with de-ionized water by a factor of about 7 to about 10, by buffing on a buff platen, thereby preventing or substantially reducing the formation and/or growth dendrites emanating from the Cu or Cu alloy lines into the bordering open silicon oxide field during subsequent processing, as by double sided brush scrubbing.

In various embodiments of the present invention, conventional substrates, inter-layer dielectrics, and barrier layers can be employed. For example, the substrate can be doped monocrystalline silicon or gallium-arsenide. The inter-layer dielectric employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. Inter-layer dielectrics in accordance with the present invention can also comprise low dielectric constant materials, including polymers, such as polyamides. The opening formed in dielectric layers are effected by conventional photolithographic and etching techniques.

An embodiment of the present invention is schematically illustrated in FIG. 1. Damascene openings are initially formed in an interdielectric layer, such as silicon oxide. The damascene openings can comprise single and/or dual damascene openings defining a pattern which includes a dense array of conductive lines bordering an open silicon oxide field. A barrier layer, e.g. TaN, is deposited to line the openings and on the surface of the interdielectric layer. Cu or a Cu alloy is then deposited on the barrier layer, as by CVD or PVD. Upon employing electroplating or electroless plating, a seedlayer can be deposited on the barrier layer to enhance nucleation. An initial CMP is then performed employing a slurry comprising about 0.2 to about 4.0 wt. % of alumina, about 2.0 to about 10 wt. % hydrogen peroxide, about 0.1 to about 0.4 wt. % of an inhibitor; about 0.2 to about 2.0 wt. % oxalic adic, and the remainder de-ionized water, substantially stopping on the barrier layer (TaN). Residual slurry is then removed by buffing on a secondary platen buff pad with water. CMP is then conducted to remove the TaN barrier layer from the dielectric surface employing a slurry containing about 1.0 to about 10 wt. % alumina, about 0.1 to about 0.5 wt. % of an inhibitor, about 1 to about 10 wt. % hydrogen peroxide, and the remainder de-ionized water. After CMP the upper surfaces of the inlaid Cu metallizaton is substantially coplanar with the upper surface of the silicon oxide inter-layer dielectric. The wafer surface is then chemically treated on a buff platen to remove about 10 Å to about 20 Å of the silicon oxide layer together with any Cu or Cu alloy contaminants which may have formed thereon during processing, thereby preventing or substantially reducing the formation and/or growth of dendrites emanating from the Cu or Cu alloy lines during prior or subsequent processing, such as double sided brush scrubbing to remove particulate material embedded and/or adhered to the surfaces of the wafer.

The present invention enables the formation of reliable Cu and/or Cu alloy interconnection members while eliminating or substantially reducing the formation and/or growth of dendritics emanating from Cu or Cu alloy lines in an efficient, cost effective manner. The inventive chemical treatment technique removes a portion of the upper surface of the dielectric layer together with any Cu or Cu alloy contaminants thereon. The present invention enjoys industrial applicability in forming various types of inlaid Cu and Cu alloy interconnection patterns. The present invention is particularly applicable in manufacturing semiconductor devices having submicron features and high aspect ratio openings, e.g. semiconductor devices with a design rule of about 0.18 micron and under.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device on a wafer, the method comprising:

forming a copper (Cu) or Cu alloy interconnection pattern comprising a dense array of spaced apart Cu or Cu alloy lines bordering an open dielectric field on a surface of the wafer; and chemically treating the wafer surface with a solution containing ammonium fluoride, diammonium hydrogen citrate, triammonium citrate, and water to remove a sufficient amount of dielectric material from the open dielectric field to prevent or substantially reduce subsequent formation and/or growth of Cu or Cu compound dendrites from the lines into the open dielectric field.

2. The method according to claim 1, comprising forming the Cu or Cu alloy interconnection pattern by a damascene technique in a silicon oxide layer, wherein the open dielectric field comprises silicon oxide.

3. The method according to claim 2, comprising applying the solution to a buff pad and buffing the wafer surface to remove silicon oxide from the open field and between the lines of the dense array.

4. The method according to claim 3, comprising rotating the buff platen at about 30 rpm to about 70 rpm while applying a pressure to the wafer of about 1 psi to about 3 psi for about 30 seconds to about 240 seconds.

5. The method according to claim 2, comprising applying a solution containing:

about 8.5 to less than about 10 wt. % diammonium hydrogen citrate;

about 6.5 to less than about 10 wt. % triammonium citrate;

about 13.5 to less than about 14.5 wt. % ammonium fluoride;

up to less than about 0.2 wt. % of an inhibitor; and about 64 to less than about 70 wt. % water.

6. The method according to claim 4, further comprising double sided brush scrubbing the wafer after chemically treating the wafer surface.

7. The method according to claim 2, comprising;

forming trenches in the silicon oxide layer;

depositing a barrier layer lining the trenches and on the silicon oxide layer;

depositing Cu or a Cu alloy layer on the barrier layer filling the trenches;

chemical mechanical polishing the Cu or Cu alloy stopping substantially at the barrier layer;

chemical mechanical polishing to substantially remove the barrier layer;

chemically treating the wafer surface; and double sided brush scrubbing the wafer.

8. The method according to claim 7, wherein the barrier layer comprises tantalum nitride.

9. The method according to claim 7, comprising:

water buffing after chemical mechanical polishing the Cu and Cu alloy layer; and water buffing after chemical mechanical polishing the barrier layer.

10. The method according to claim 1, wherein the dense array comprises lines spaced apart by less than about 2 microns, and the open field extends greater than about 2 microns between conductive lines.

11. The method according to claim 10, comprising removing up to about 20 Å of dielectric material from the open dielectric field.

12. A method for preventing the growth of dendrites emanating from copper (Cu) or Cu alloy lines into a bordering open dielectric filed on a wafer surface the method comprising chemically treating the wafer surface with a solution containing ammonium fluoride, diammonium hydrogen citrate, triammonium citrate, and water to remove a portion of dielectric material from the surface of the open dielectric field and from between the lines.

13. The method according to claim 12, wherein the bordering dielectric field comprises silicon oxide.

14. The method according to claim 13, comprising removing up to 20 Å of silicon oxide from the open dielectric field.

15. The method according to claim 14, comprising applying the solution to a buff pad and buffing the wafer surface.

16. The method according to claim 15, comprising rotating the buff platen at about 30 rpm to about 70 rpm while applying a pressure of about 1 psi to about 3 psi to the wafer for about 30 seconds to about 240 seconds.

17. The method according to claim 16, comprising applying a solution containing:

about 8.5 to less than about 10 wt. % diammonium hydrogen citrate;

about 6.5 to less than about 10 wt. % triammonium citrate;

about 13.5 to less than about 14.5 wt. % ammonium fluoride;

up to less than about 0.2 wt. % of an inhibitor; and about 64 to less than about 70 wt. % water.

18. The method according to claim 17, wherein the inhibitor comprises benzotriazole or 1,2,4-triazole.

* * * * *